United States Patent [19]

Chu et al.

[11] Patent Number: 5,663,666

[45] Date of Patent: Sep. 2, 1997

[54] DIGITAL PHASE DETECTOR

[75] Inventors: David C. Chu, Woodside; Jeremy S. Sommer, Los Altos, both of Calif.

[73] Assignee: Hewlett-Packard Company, Palo Alto, Calif.

[21] Appl. No.: 604,230

[22] Filed: Feb. 21, 1996

[51] Int. Cl.$^6$ .................................................. G01R 25/00
[52] U.S. Cl. ............................... 327/7; 327/10; 327/12
[58] Field of Search ........................ 327/3, 7, 10, 12, 327/117

[56] References Cited

U.S. PATENT DOCUMENTS 5,260,975  11/1993  Saito .................................. 327/3
5,321,369   6/1994  Wolaver ............................. 327/3
5,477,177  12/1995  Wong et al. ....................... 327/3

*Primary Examiner*—Margaret Rose Wambach
*Attorney, Agent, or Firm*—Pamela Lau Kee

[57] ABSTRACT

In the present embodiment, digital phase detection of digital telecommunications signals is based on heterodyning. The frequency of two signals are scaled to different nominal values that are separated by a typically small but finite difference. The two frequencies are then mixed to generate a finite beat frequency. In mixing, phase is preserved and the finite beat frequency phase is in one-to-one correspondence with the signal phase. Phase detection is performed indirectly at the lower finite beat frequency with high resolution and greater ease than direct phase detection.

20 Claims, 6 Drawing Sheets

DIGITAL PHASE DETECTOR

FIELD OF THE INVENTION

The invention is directed towards the design of clocks used for synchronization in telecommunication. In particular, the invention is directed toward digital measurement of phase deviations of telecommunication signals.

BACKGROUND OF THE INVENTION

Phase detection is the process of measuring the phase difference between two oscillations. Most phase detectors encountered in common phase-locked loop (PLL) circuits are analog in nature and of limited dynamic range. These phase detectors, such as MC12040 offered by Motorola, are well known in the art. Generally, such phase detectors generate an output voltage indicative of the phase difference between two oscillations that are close in frequency. The polarity of the output voltage indicates which oscillation is leading the other. The magnitude of the output voltage tends to be proportional to the phase difference. Analog phase detectors are able to detect a fraction of a cycle and rapidly produce a usable (analog) output. However, the dynamic range of proportionality is typically limited to one cycle in each direction.

For telecommunication network synchronization, phase detection between an input reference signal and a local oscillator signal is required. Signal variations in these applications are slower. Analog phase measurement becomes a problem for very long time constants. Digital phase detection is preferred for phase detection of dynamic ranges wider than 1 or 2 cycles. Consequently, electronic counters are often used as phase detectors. The number of counts corresponds to the phase progression and the phase can be measured with much wider dynamic ranges. The resolution is 1 count or 1 cycle.

As shown in FIG. 1, Lesea disclosed in U.S. Pat. No. 4,947,382 a phase detector based on homodyning: detecting phase difference between two oscillations of the same nominal frequency. The phase detector includes two 16-bit-wide counters L28, L32. When the contents of counter L32 overflow, the contents of counter L28 are read by latch L34, producing the phase difference between the two oscillating signals. One phase difference value is generated every 65,536 counts of latch L34, at a 31 Hz rate, with a phase resolution of ±1 cycle, and a dynamic range of 65,566 cycles. The two signals have the same nominal frequency.

As shown in FIG. 2, Scordo described, in U.S. Pat. No. 4,633,193, another counter-based phase detector. The signals have different frequencies, but the moduli of the counters S400, S401 are adjusted to accommodate the frequency ratio by overflowing at the same nominal rates of 1 kHz. The system behaves as a homodyning system. The resolution of the example Ts=1 ms. The resolution is ±1 cycle at a rate of 1 kHz. The dynamic range is 2048 cycles.

SUMMARY OF THE INVENTION

In the present embodiment, phase detection is based on heterodyning. A scaled frequency signal is intentionally synthesized from a local oscillator to be nominally a small but finite value in difference in frequency from that of a reference signal. The scaled and the reference frequencies are then mixed to generate a finite beat note. In mixing, the signal phase is preserved and the beat note phase is in one-to-one correspondence with the reference signal phase. Phase detection is performed at the lower frequency beat note with high resolution and greater ease.

The scaled frequency is synthesized by a frequency synthesizer from a local oscillator. The scaled nominal frequency is close to, but does not equal the nominal frequency of an input being detected. Specifically, the scaled to input nominal frequencies bear the ratio of M/(M+1) or M/(M−1), where M is a positive integer. The two frequencies are mixed together by a mixing means which produces logic states indicative of the progression of the phase differences between the scaled and the input frequency. Since the two signals have different frequencies, their phase will periodically come in and out of phase with each other. A finite state machine analyzes the phase progression and produces a signal, the beat note, indicative of each phase alignment. The beat note is also used to activate an accumulator to increment or decrement in accordance with a polarity bit. Both accumulator and counter latch outputs are weighted and summed to produce a digital representation of the phase deviation between the actual input reference frequency and a frequency equal to the local oscillator frequency scaled by the ratio of nominal input frequency to the nominal LO frequency.

DETAILED DESCRIPTION OF THE PREFERRED EMBODIMENTS

Figure 1:
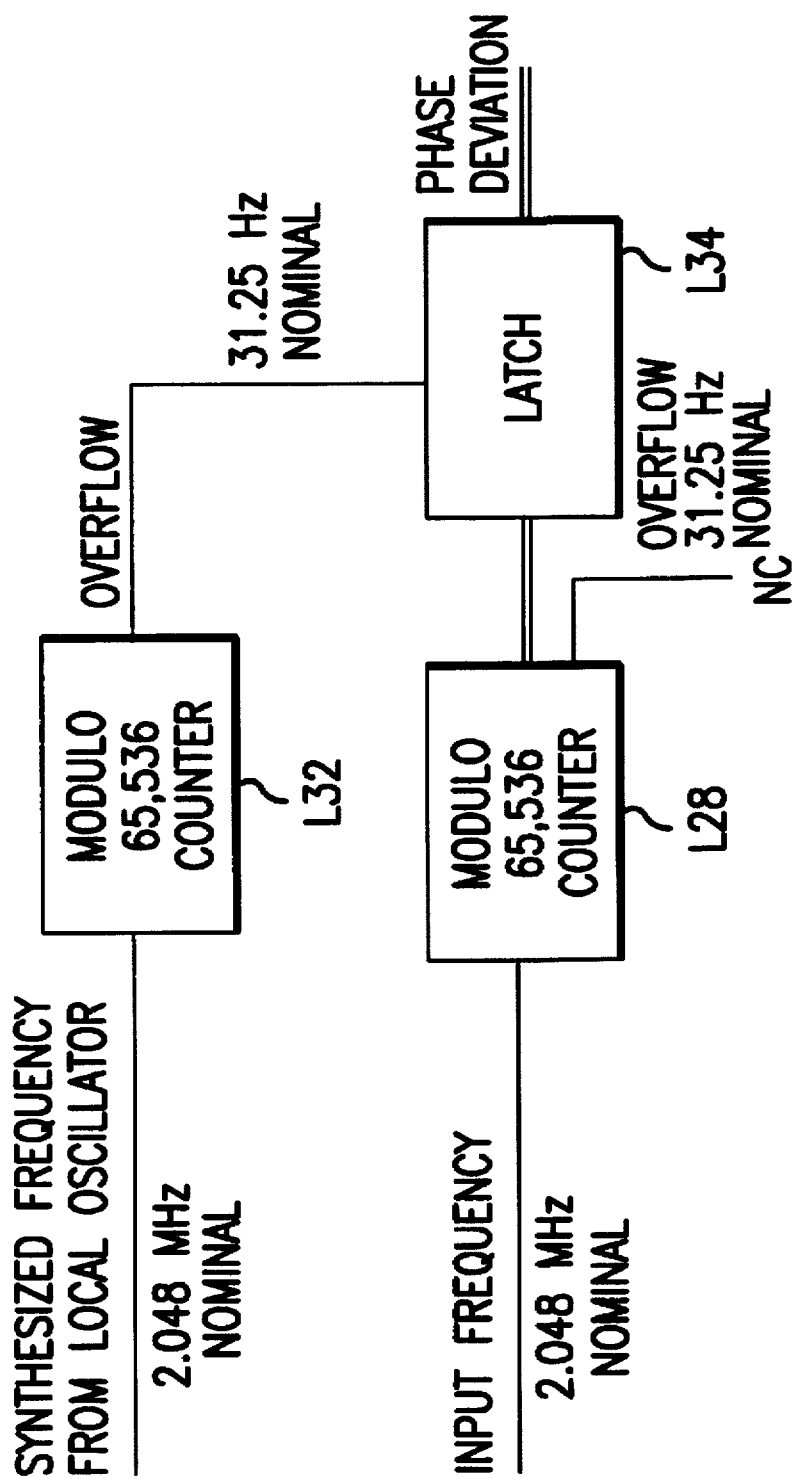
FIG. 1 illustrates a prior art phase detector.
Figure 2:
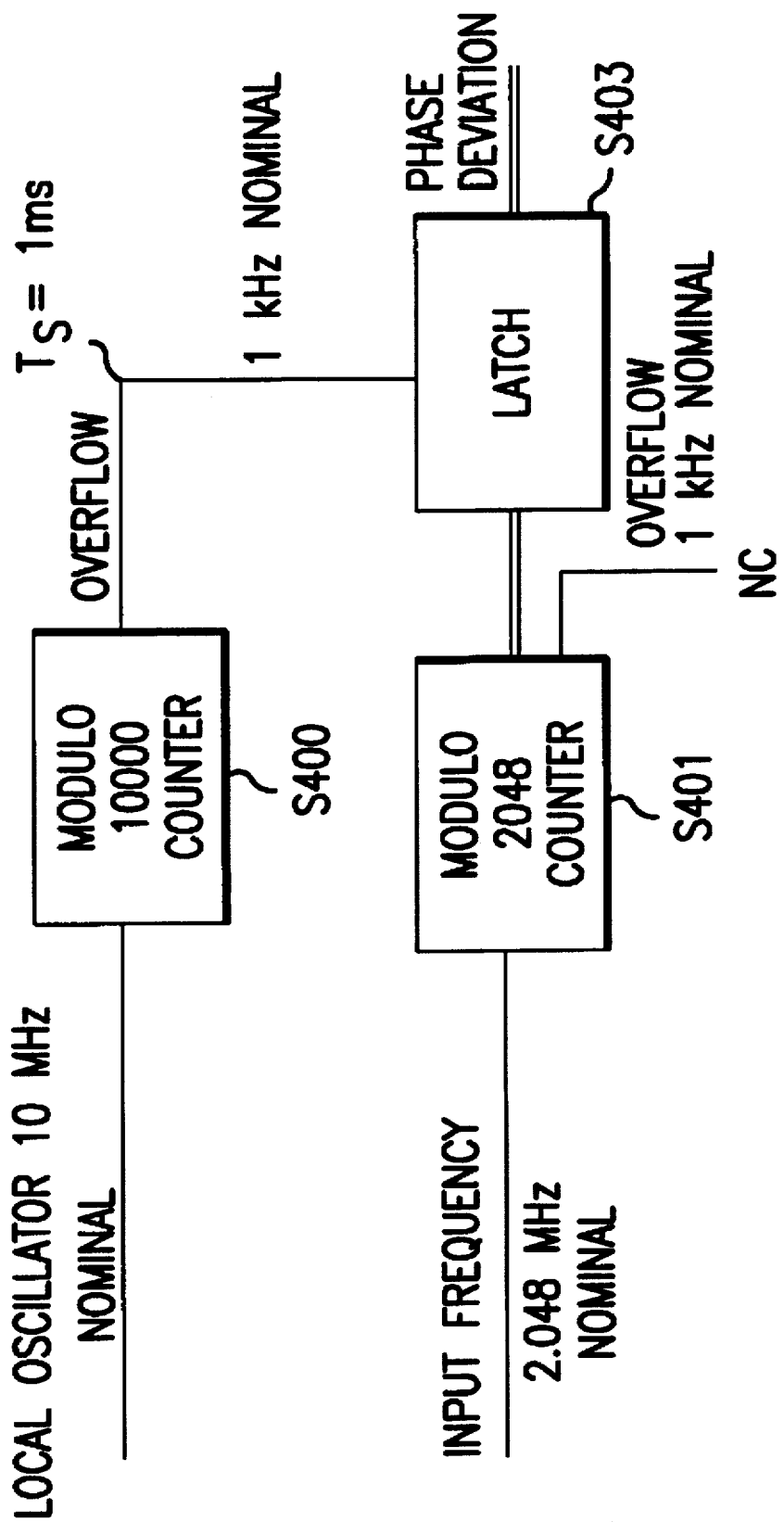
FIG. 2 illustrates another prior art phase detector.
Figure 3:
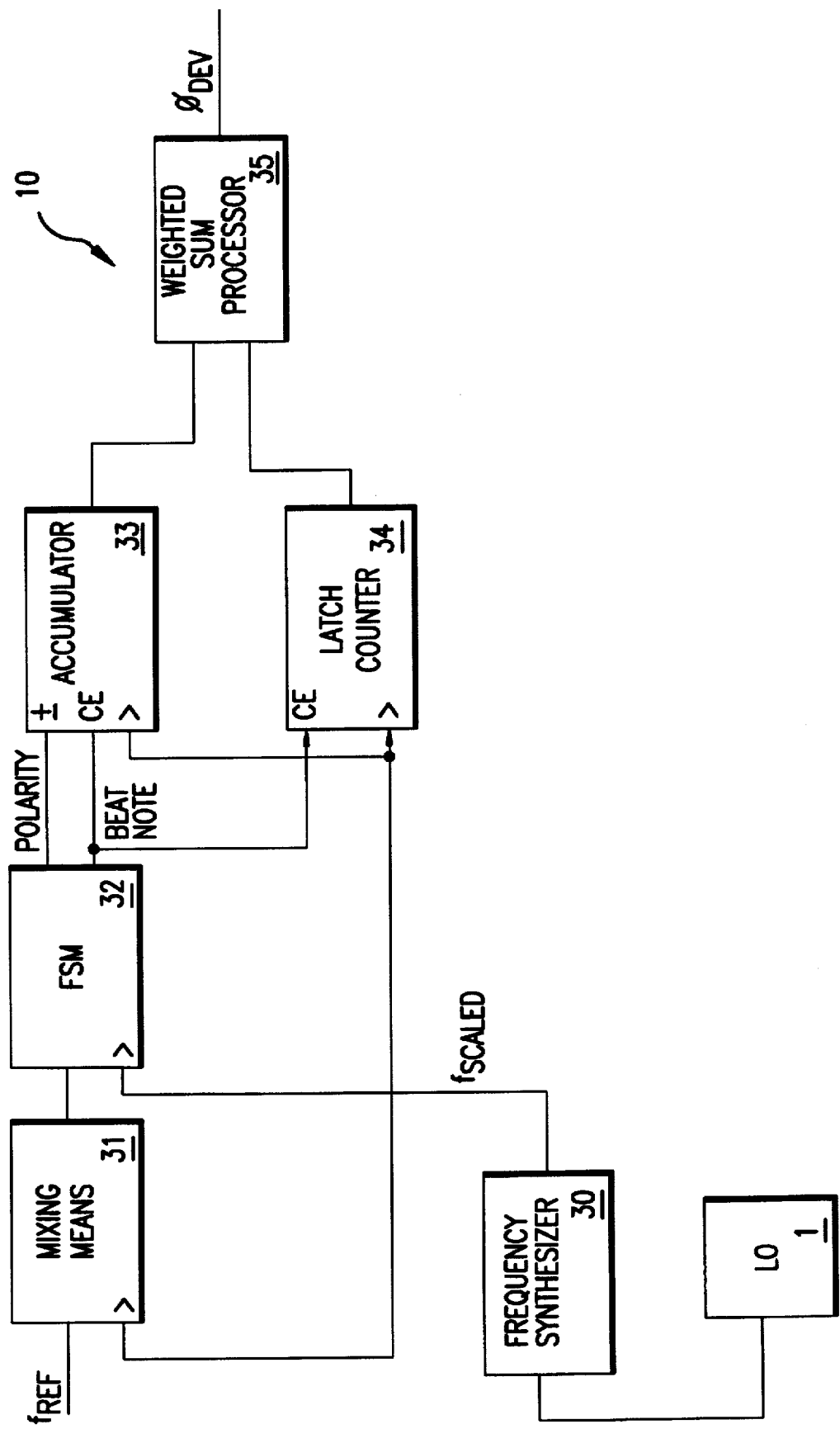
FIG. 3 illustrates a generic phase detector according to the present invention.

FIG. 3 illustrates a functional block diagram for a generic digital phase detection system 10 in accordance with the present invention. A frequency synthesizer 30 receives a local oscillator signal from a local oscillator 1 (LO). A mixing means 31, that receives as an input a reference signal, is connected to the frequency synthesizer 30 and a finite state machine 32 (FSM). The FSM 32 is connected to the frequency synthesizer 30, an accumulator 33, and a latch counter 34. A weighted sum processor 35 is connected to the accumulator 33 and the latch counter 34. The weighted sum processor 35 produces a $\phi_{DEV}$ output term 39 that corresponds to the phase deviation between the reference signal and the LO signal scaled by the ratio of the reference nominal frequency to the LO nominal frequency.

The scaled signal has a nominal frequency $f_{SCALED}$ which is M/(M±1) of the nominal reference frequency $f_{REF}$, where M is a positive integer. These two frequencies are mixed by the mixing means 31 and the resulting output is analyzed by the FSM 32. The FSM 32 produces two signals: beat note and polarity bit. During analysis, the beat note executes a true state when the FSM 32 determines that the reference and scaled signals are in phase alignment. At the time of phase alignment, the polarity bit indicates which of these two signals are higher in frequency. A true state of the beat note signifies that the value of the latch counter 34, which monitors the scaled signal, should be latched. This true state of the beat note also triggers the incrementing or decrementing of the accumulator 33 according to the polarity bit. The results from the accumulator 33 and the latch counter 34 are weighted and summed by the weighted sum processor 35 to produce the $\phi_{DEV}$ output signal.

This generic implementation may be used to generate common telecommunication frequencies from 4 types of reference signals: 1.544 MHz, 2.048 MHz, 5 MHz, or 10 MHz. When the local oscillator signal is nominally 10 MHz, a residual phase difference is generated between the reference signal and the corresponding signal: $f_{LO}*0.1544$, $f_{LO}*0.2048$, $f_{LO}*1$, or $f_{LO}*0.5$. Table 1 illustrates some values of interest to the telecommunications industry.

TABLE 1

| $f_{SCALED}$(MHz) | M:M ± ratio | $f_{REF}$(MHz) |
|---|---|---|
| 1.540 | 385/386 | 1.544 |
| 2.040 | 255/256 | 2.048 |
| 2.042553191 | 375/376 | 2.048 |
| 2.051282051 | 625/624 | 2.048 |
| 2.053333333 | 385/384 | 2.048 |
| 5.005 | 1001/1000 | 5 |
| 5.1 | 51/50 | 5 |
| 5.106382980 | 48/47 | 5 |
| 5.128205130 | 40/39 | 5 |
| 10.01 | 1001/1000 | 10 |
| 10.2 | 51/50 | 10 |
| 10.21276596 | 48/47 | 10 |
| 10.25641026 | 40/39 | 10 |

Figure 4:
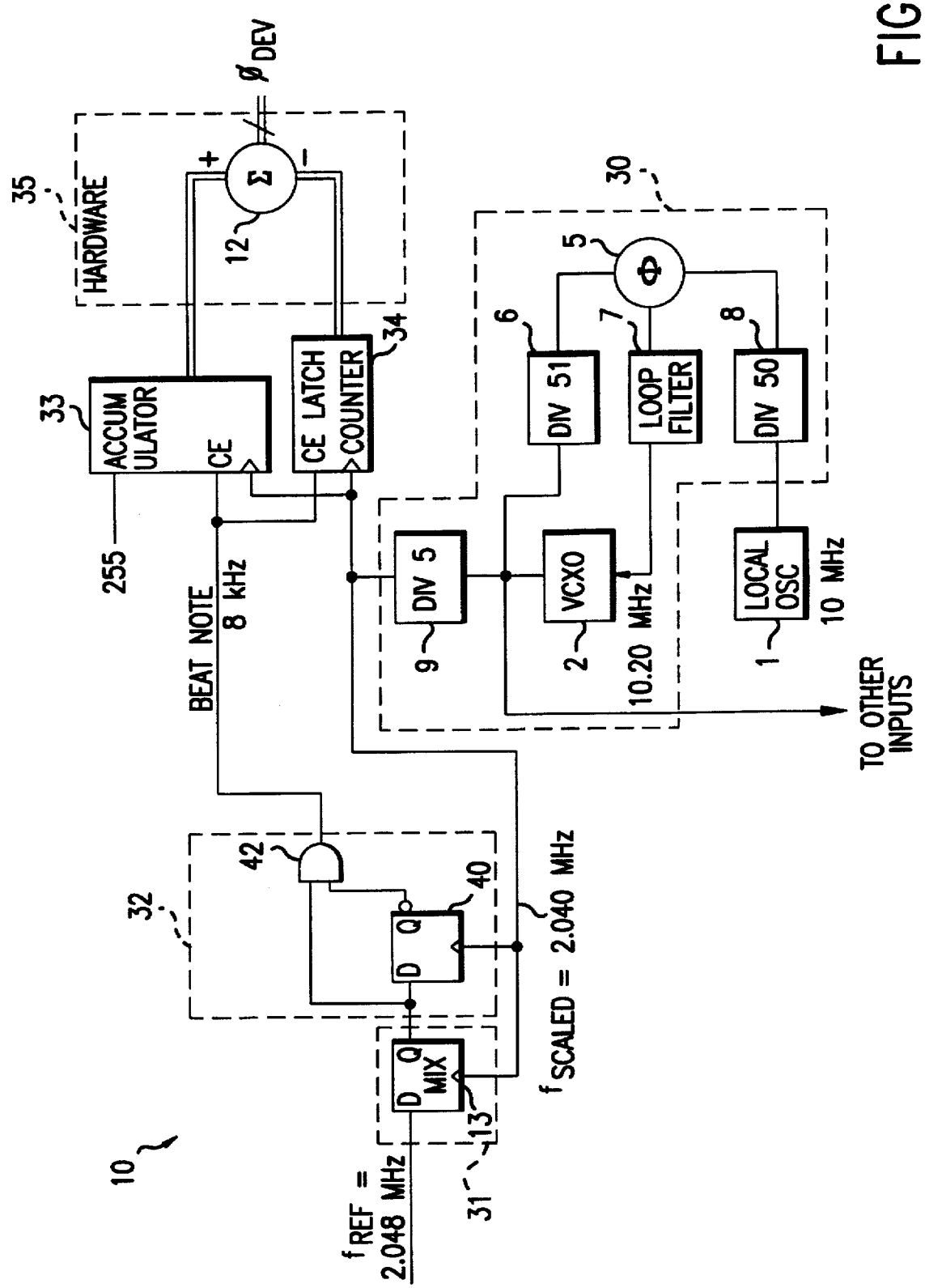
FIG. 4 illustrates an single sideband embodiment of the generic phase detector shown in FIG. 3.

FIG. 4 illustrates a single sideband embodiment of the generic phase detector shown in FIG. 3. The FSM 25 consists of a D flip flop 40 and an AND gate 42. The weighted sum processor 35 is an accumulator 12.

For purposes of illustration, the frequency synthesizer 30 includes a divider 6 which divides the voltage tuned crystal oscillator (VCXO) 2 by 51, and the divider 8 which divides the LO 1 frequency by 50. The outputs of the dividers 6, 8 are inputs to an analog phase detector 5, the voltage of the analog phase detector 5 is integrated and filtered by an analog loop filter 7. The output of the loop filter is used to tune the VCXO 2. The output of the VCXO 2 is divided by 5 by a divider 9. Phase lock loop (PLL) frequency synthesis techniques are well known in the art. In this example, a scaled frequency, where nominal $f_{SCALED}$=2.040 MHz may be generated from a LO frequency that is nominally at 10 MHz. The LO 1 is a high quality quartz oscillator under oven control. Because the VCXO 2 is tightly locked to the LO 1 by the phase-lock loop, VCXO 2 derives its accuracy from the LO 1.

The operation of the digital phase detection system will be described with respect to the illustration described above, where the nominal $f_{REF}$=2.048 MHZ and nominal $f_{SCALED}$=2.040 MHZ. Phase detection is performed by mixing the $f_{SCALED}$ with $f_{REF}$ using a D-flip flop as the mixing means 31. The output of the mixing means 31 is nominally at 8 kHz. The FSM 32 selects a positive transition of the mixing means 31 and produces a true state for the beat note. The latch counter 34 continuously counts $f_{SCALED}$ at 2.040 MHz. The latch counter 34 is latched by a true state of the beat note. When the latch counter 34 value is latched, the 16-bit wide accumulator 33 is simultaneously incremented by 255. The weighted sum processor 35 subtracts the reading of the latch counter 34 from the accumulator value. The output of the weighted sum processor 35 is a digital representation of the phase difference between the $f_{REF}$ and 0.2048 times $f_{LO}$, when $f_{LO}$ is nominally 10 MHz. Each bit of the output of the weighted sum processor 35 has a value 1/255 cycle of phase, or about 1.4 degrees. The dynamic range of this embodiment is 257 cycles. Phase difference data is produced at the average rate of 8 kHz.

Figure 5:
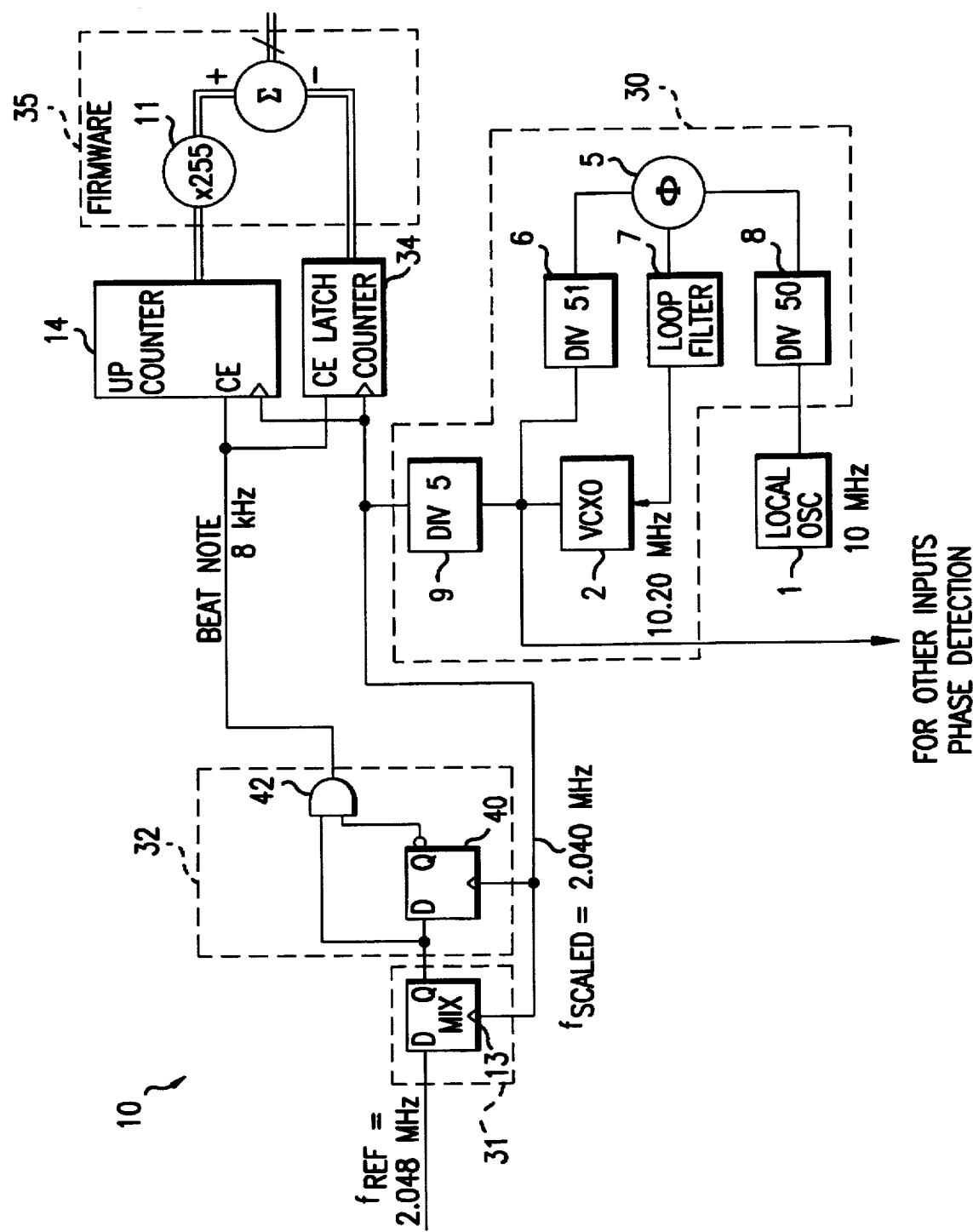
FIG. 5 illustrates another single sideband embodiment of the generic phase detector shown in FIG. 3.

FIG. 5 illustrates another single sideband embodiment of the generic digital phase detection system 10 shown in FIG. 3. The accumulator 34 is replaced by an up-down counter 14 that counts the beat note true states. The weighted sum processor 35 includes a microprocessor 11 that multiplies the value of the counter 14 by 255, and performs a subtraction of the result from the latch counter 34 reading, tracking all overflows. Because all of the weighted sum processing occurs in firmware with wide registers, the dynamic range is increased.

In these single sideband embodiments, the reference frequency fluctuation is limited to one side of the scaled frequency at all times. For FIGS. 4 and 5, the reference frequency $f_{REF}$ cannot be less than 2.040 MHz at any time. Under severe modulation, the frequency deviation of $f_{REF}$ may exceed 8 kHz. A double-sideband embodiment, as shown in FIG. 6, may be used to accommodate the reference frequency on either side of the scaled frequency.

Figure 6:
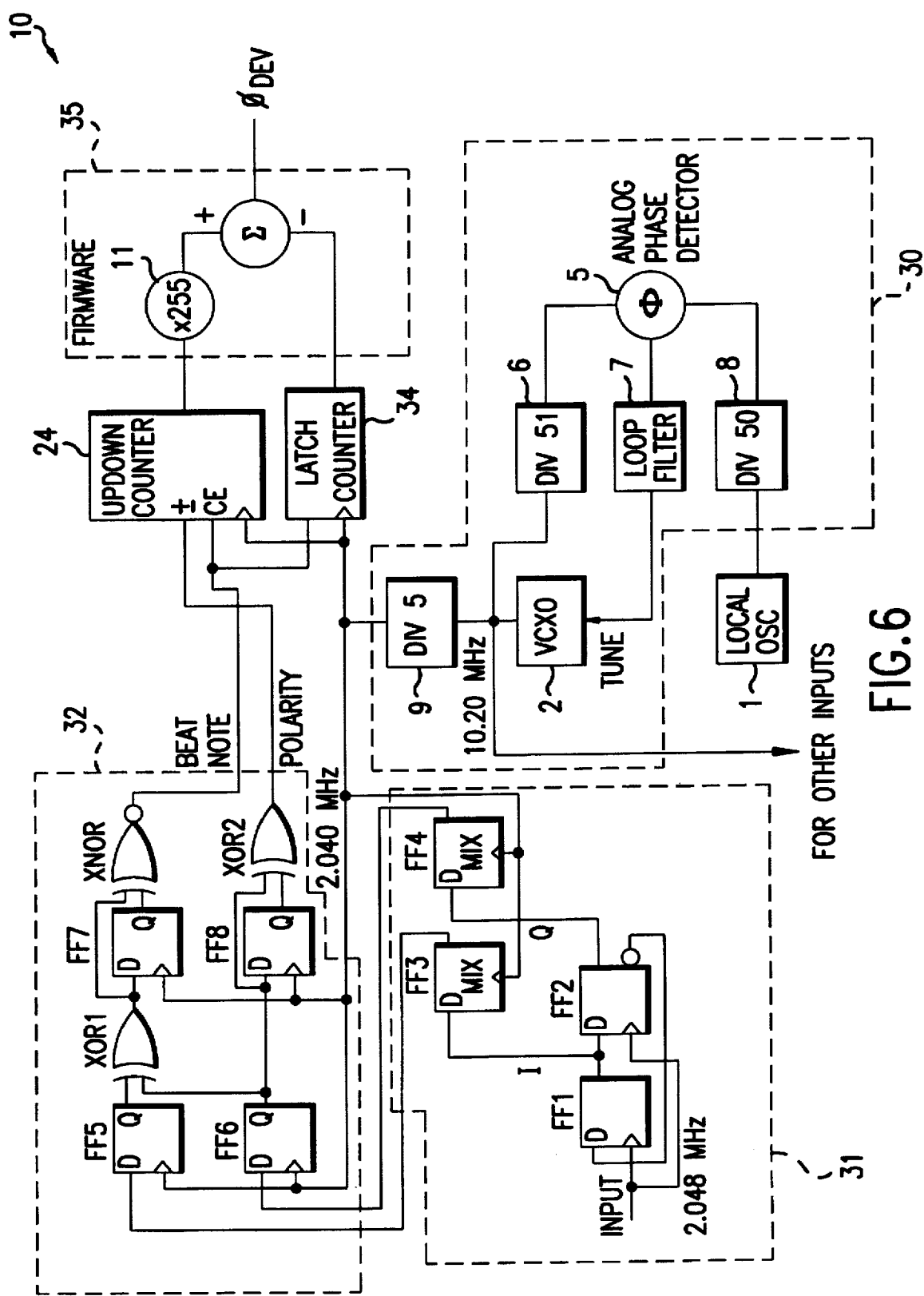
FIG. 6 illustrates dual side band embodiment of the generic phase detector shown in FIG. 3.

FIG. 6 illustrates a double-sideband embodiment of the invention shown in FIG. 3. An output of a flip-flop FF1 is connected to an input of a flip-flop FF2. The negated output of the FF2 is connected to the input of the FF1. The outputs of the FF1 and the FF2 are connected to inputs of a flip-flop FF3 and a flip-flop FF4, respectively. The outputs of the FF3 and FF4 are connected to inputs of a flip-flop FF5 and a flip-flop FF6, respectively. The outputs of the FF5 and FF6 are inputs to a first exclusive OR XOR1. The output of XOR1 and the output of the FF6 are connected to inputs of a flip-flop FF7 and a flip-flop FF8, respectively. The output XOR1 and the output of the FF7 are connected to an exclusive NOR (XNOR). The input and output of the FF8 are inputs to a second exclusive OR XOR2. The clocks of FF3 through FF8 are connected to the scaled signal. The clocks of FF1 and FF2 are connected to the reference clock. FF1-4 corresponds to the mixing means 31 while the remaining sequential logic corresponds to the FSM 32. In addition, FF1 and FF2 form a Johnson counter, which divides the reference signal into in-phase and quadrature components at one-fourth the reference frequency.

The operation of the dual sideband embodiment will be described using the same illustration as FIG. 4 for the frequency synthesizer 30. The Johnson counter produces 4 distinct states are cyclically repeated during a 4 cycle period, at the nominal reference frequency $f_{REF}$=2.048 MHZ. However, the states are effectively sampled at the mixing means 31 at the nominal rate of 2.040 MHz. Therefore at an average rate of 8 kHz, a "skip" will be detected. A "skip" corresponds to a missing state. Upon detection of a "skip", the beat note goes true to enable the latch 3 and the up-down counter 24. The up-down counter 24 will increment as indicated by the polarity bit.

Under heavy modulation, the reference frequency $f_{REF}$ may momentarily be less than $f_{SCALED}$. As a result, a "stick" or a repeated state will be observed. Under this condition, the beat note also goes true to enable the latch 3 and the up-down counter 24, but the polarity bit will indicate decrementing of the up-down counter 24.

In this illustration, the M:M+1ratio of 255/256 is a mathematical analogy to a pair of vernier calipers that magnify the small time difference and increase the phase resolution by a factor of M, where M=255.

Although the above embodiments have been described with respect to a reference signal of 2.048 MHz and a ratio of 255:256, the above description merely illustrates the operation of the digital phase detection system.

What is claimed is:

1. A digital phase detection system having a reference signal having a nominal reference frequency and a local signal having a nominal frequency comprising:
   a frequency synthesizer being operative to receive the local signal and to produce a scaled signal having a scaled frequency;
   mixing means receiving the reference and scaled signals for generating a mixed signal that reflects a beat frequency and corresponds to mixing the scaled and the nominal reference frequencies;
   a finite state machine, connected to the mixing means and the frequency synthesizer, being operative to interpret the mixed signal and to generate action commands;
   a counter with latch, connecting to the finite state machine, the mixing means, and the frequency synthesizer, being operative to latch a value of counts corresponding to the scaled signal;
   an accumulator having an accumulator value, connected to the finite state machine, receiving the scaled signal, being operative to respond to the action commands;
   a weighted sum processor, connected to the accumulator and the latch, combining the latch and accumulator values to determine the phase difference between the reference signal and the local signal scaled by the ratio of the nominal reference frequency and the nominal frequency of the local oscillator signal.

2. A digital phase detection system, as defined in claim 1, wherein the ratio of the nominal scaled frequency to the nominal reference frequency is M:M+1, where M is a positive integer.

3. A digital phase detection system, as defined in claim 2, wherein the the nominal scaled frequency is 255/256 of 2.048 MHz.

4. A digital phase detection system, as defined in claim 2, wherein the nominal scaled frequency is 385/386 of 1.544 MHz.

5. A digital phase detection system, as defined in claim 2, wherein the nominal scaled frequency is 375/376 of 2.048 MHz.

6. A digital phase detection system, as defined in claim 1, wherein the ratio of the nominal scaled frequency to the nominal reference frequency is M:M−1, where M is a positive integer.

7. A digital phase detection system, as defined in claim 6, wherein the nominal scaled frequency is 625/624 of 2.048 MHz.

8. A digital phase detection system, as defined in claim 6, wherein the nominal scaled frequency is 385/384 of 2.048 MHz.

9. A digital phase detection system, as defined in claim 6, wherein the nominal scaled frequency is 1001/1000 of 5 MHz.

10. A digital phase detection system, as defined in claim 4, wherein the nominal scaled frequency is 51/50 of 5 MHz.

11. A digital phase detection system, as defined in claim 6, wherein the nominal scaled frequency is 48/47 of 5 MHz.

12. A digital phase detection system, as defined in claim 4, wherein the nominal scaled frequency is 40/39 of 5 MHz.

13. A digital phase detection system, as defined in claim 6, wherein the nominal scaled frequency is 1001/1000 of 10 MHz.

14. A digital phase detection system, as defined in claim 6, wherein the nominal scaled frequency is 51/50 of 10 MHz.

15. A digital phase detection system, as defined in claim 6, wherein the nominal scaled frequency is 48/47 of 10 MHz.

16. A digital phase detection system, as defined in claim 6, wherein the nominal scaled frequency is 40/39 of 10 MHz.

17. A digital phase detection system, as defined in claim 1, wherein:
   the mixing means includes a D-flip-flop latch clocked by the scaled signal, the mixed signal is produced by latching the reference signal, and
   the finite state machine selects a positive transition of the mixed signal to produce a beat note true state and produces an action command corresponding to the beat note.

18. A digital phase detection system, as defined in claim 1, wherein:
   the mixing means includes,
      a 2-bit Johnson counter, having two outputs, being operative to divide the reference frequency by 4 into in-phase and quadrature components, and
      two D-flip-flops, each D-flip flop having
   an input connected to a corresponding one of the Johnson counter outputs, being operative to clocking by the scaled signal;
   the finite state machine produces an action command bit upon detecting a lack of order in transition in the mixing signal and a polarity bit corresponding to the nature of the lack of order in transition; and
   the accumulator and the latch counter respond to the action command, and the accumulator in a polarity indicated by the polarity bit.

19. A digital phase detection system, as defined in claim 1, wherein:
   the accumulator has an operand of M; and
   the weighted sum processor is an adder with equal width addants that subtracts without regard to a final carry.

20. A digital phase detection system, as defined in claim 1, wherein:
   the accumulator behaves as an up-down counter; and
   the weighted sum processor is a microprocessor that multiplies the contents of the accumulator by M and subtracts the result from the content of the counter with latch, tracking all register overflows.

* * * * *